(12) United States Patent
Liu et al.

(10) Patent No.: US 10,340,296 B2
(45) Date of Patent: Jul. 2, 2019

(54) ARRAY SUBSTRATE AND DISPLAY DEVICE

(71) Applicant: BOE TECHNOLOGY GROUP CO., LTD., Beijing (CN)

(72) Inventors: Guanghui Liu, Beijing (CN); Bin Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/328,541

(22) PCT Filed: Jan. 22, 2016

(86) PCT No.: PCT/CN2016/071734
§ 371 (c)(1),
(2) Date: Jan. 24, 2017

(87) PCT Pub. No.: WO2017/036073
PCT Pub. Date: Mar. 9, 2017

(65) Prior Publication Data
US 2017/0221935 A1    Aug. 3, 2017

(30) Foreign Application Priority Data
Aug. 31, 2015 (CN) .......................... 2015 1 0549808

(51) Int. Cl.
*H01L 27/12* (2006.01)
*H01L 27/15* (2006.01)
(Continued)

(52) U.S. Cl.
CPC ........ *H01L 27/1248* (2013.01); *G02F 1/1368* (2013.01); *H01L 21/425* (2013.01);
(Continued)

(58) Field of Classification Search
CPC ............. H01L 21/425; H01L 29/66969; H01L 29/78633; H01L 29/78693; H01L 27/1248;
(Continued)

(56) References Cited

U.S. PATENT DOCUMENTS 5,714,286 A    2/1998  Uchikawa et al.
2001/0024253 A1*  9/2001  Ishihara ............ G02F 1/133615
                                                      349/113
(Continued)

FOREIGN PATENT DOCUMENTS

CN    101533857 A    9/2009
CN    102969361 A    3/2013
(Continued)

OTHER PUBLICATIONS

Chinese Office Action dated Jun. 28, 2017.
(Continued)

*Primary Examiner* — Yosef Gebreyesus
(74) *Attorney, Agent, or Firm* — Dilworth & Barrese, LLP.; Michael J. Musella, Esq.

(57) ABSTRACT

An array substrate and a display device are provided for solving a problem of drift of an I-V curve of a thin film transistor because the oxide active layer is irradiated with light in the prior art. The array substrate includes a plurality of thin film transistors arranged in an array, wherein, each of the thin film transistors includes an oxide active layer, and the array substrate further includes a light absorption layer provided above the oxide active layer, the light absorption layer is used for absorbing light irradiated thereon, and an orthographic projection of the light absorption layer on the oxide active layer at least partly covers an active region of the oxide active layer.

8 Claims, 1 Drawing Sheet

(51) Int. Cl.
*H01L 21/425* (2006.01)
*H01L 29/66* (2006.01)
*H01L 29/786* (2006.01)
*G02F 1/1368* (2006.01)
*G02F 1/1343* (2006.01)

(52) U.S. Cl.
CPC .......... *H01L 27/12* (2013.01); *H01L 27/1225* (2013.01); *H01L 27/1262* (2013.01); *H01L 27/15* (2013.01); *H01L 29/66969* (2013.01); *H01L 29/786* (2013.01); *H01L 29/78633* (2013.01); *H01L 29/78693* (2013.01); *G02F 2001/134318* (2013.01); *G02F 2001/134381* (2013.01)

(58) Field of Classification Search
CPC . H01L 27/1225; H01L 27/1262; H01L 27/12; H01L 27/15; H01L 29/786; G02F 1/1368; G02F 2001/134381; G02F 2001/134318
See application file for complete search history.

(56) References Cited

U.S. PATENT DOCUMENTS

| | | | |
|---|---|---|---|
| 2009/0230390 A1 | 9/2009 | Gosain et al. | |
| 2010/0270553 A1* | 10/2010 | Choi | G02F 1/136209 257/59 |
| 2010/0289977 A1* | 11/2010 | Liu | G02F 1/1362 349/44 |
| 2011/0200810 A1* | 8/2011 | Kubota | G02B 1/04 428/220 |
| 2012/0001170 A1* | 1/2012 | Yamazaki | H01L 27/1225 257/43 |
| 2014/0183521 A1* | 7/2014 | Hsu | H01L 29/78633 257/43 |
| 2014/0285914 A1* | 9/2014 | Sakano | G02B 5/20 359/892 |
| 2015/0179802 A1* | 6/2015 | Kim | H01L 29/7869 257/43 |
| 2015/0349040 A1* | 12/2015 | Park | H01L 33/40 257/40 |

FOREIGN PATENT DOCUMENTS

| | | | |
|---|---|---|---|
| CN | 103579354 A | | 2/2014 |
| CN | 103579354 A | * | 12/2014 |
| CN | 105070729 A | | 11/2015 |

OTHER PUBLICATIONS

International Search report dated May 31, 2016.
Second Chinese Office Action dated Nov. 1, 2017.
Extended European Search Report dated Apr. 2, 2019.

* cited by examiner

ARRAY SUBSTRATE AND DISPLAY DEVICE

TECHNICAL FIELD

The present invention relates to a field of display technology, and more particularly, relates to an array substrate and a display device.

BACKGROUND

At present, with continuous increase in a size of a display, and continuous improvement of frequency of a driving circuit, it has been very difficult for mobility of an existing amorphous silicon thin film transistor to meet demands, but a thin film transistor (TFT) having a channel formed by a metal oxide semiconductor with a high mobility (hereinafter referred to as a metal oxide TFT) has been gradually widely used in the field of display. The metal oxide TFT has advantages such as high mobility, good uniformity, transparency, and simple fabrication process, which helps to implement a display device of a large size and having a driving circuit with high frequency, and thus, becomes a focus of research.

An amorphous indium gallium zinc oxide is a typical transparent metal oxide semiconductor, which has a good light transmission for visible light. When irradiated by light with a wavelength of 420 nm or more, an I-V curve of the amorphous indium gallium zinc oxide TFT is relatively stable; but when irradiated by ultraviolet light with a wavelength less than 420 nm, the I-V curve of the amorphous indium gallium zinc oxide TFT starts to drift by a large margin, and is very unstable. This is because energy of ultraviolet light is already higher than a forbidden bandwidth of the amorphous indium gallium zinc oxide, resulting in drift of the I-V curve of the amorphous indium gallium zinc oxide TFT. Thus, it is a difficult point in the art to ensure light stability of the oxide semiconductor TFT.

SUMMARY

The object of the present invention is to provide an array substrate and a display device which can alleviate or avoid the above problem.

An aspect of the invention provides an array substrate, comprising a plurality of thin film transistors arranged in an array, wherein, each of the thin film transistors includes an oxide active layer, and the array substrate further comprises a light absorption layer provided above the oxide active layer, the light absorption layer is used for absorbing light irradiated thereon, and an orthographic projection of the light absorption layer on the oxide active layer at least partly covers an active region of the oxide active layer.

Optionally, the light absorption layer is made of silicon carbide or black zirconia.

Optionally, the light absorption layer is made of an organic material containing any one or more selected from the group consisting of iron, nickel and chromium.

Optionally, an interface improving layer is provided between the light absorption layer and the oxide active layer, the interface improving layer is directly provided on the active layer, and the light absorption layer is directly provided on the interface improving layer.

Optionally, the interface improving layer is made of any one or more selected from the group consisting of silicon oxide, silicon oxynitride, silicon nitride and zirconium oxide.

Optionally, the thin film transistor includes an etching blocking layer for protecting the oxide active layer, and the light absorption layer is provided above or below the etching blocking layer.

Optionally, the array substrate comprises a passivation layer for protecting the thin film transistor, which is located on the thin film transistor; and the light absorption layer is provided above or below the passivation layer.

Optionally, the thin film transistor includes an etching blocking layer for protecting the oxide active layer, and the light absorption layer is formed by performing ion injection on the etching blocking layer.

Optionally, the array substrate comprises a passivation layer for protecting the thin film transistor, which is located on the thin film transistor; and the light absorption layer is formed by performing ion injection on the passivation layer.

Optionally, an ion used for ion injection may be any one or more selected from of the group consisting of a carbon ion, an iron ion, a nickel ion and a chromium ion.

Optionally, the orthographic projection of the light absorption layer on the oxide active layer covers the active region of the oxide active layer.

Optionally, the orthographic projection of the light absorption layer on the oxide active layer completely coincides with the active region of the oxide active layer.

Another aspect of the invention provides a display device, comprising any array substrate as mentioned above.

In the array substrate and the display device provided by the invention, due to the light absorption layer above the oxide active layer of the thin film transistor, the light absorption layer at least can reduce or prevent light irradiated on the active region of the oxide active layer, so as to reduce or avoid drift of the I-V curve of the thin film transistor, and improve light stability of the oxide semiconductor thin film transistor.

BRIEF DESCRIPTION OF THE DRAWINGS

The drawings are provided for a further understanding of the present invention, and constitute a part of the specification; the drawings together with the specific embodiments are used to explain the present invention, rather than form a limitation thereto. In the drawings.

DETAILED DESCRIPTION

In order to make those skilled in the art better understand the technical solutions of the embodiments of the present invention, the present invention is further described in detail in conjunction with the drawings and specific implementing modes.

Embodiment 1

Figure 1:
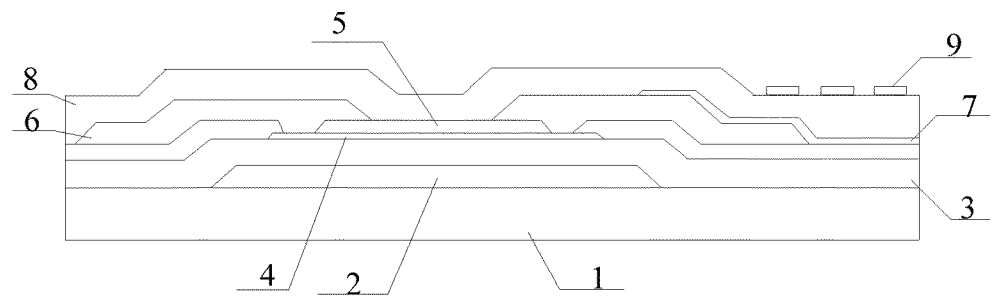
FIG. 1 is a structural schematic diagram of an array substrate provided by Embodiment 1 of the present invention.

FIG. 1 is a structural schematic diagram of an array substrate provided by Embodiment 1 of the present invention. As illustrated in FIG. 1, this embodiment provides an array substrate, comprising a plurality of thin film transistors arranged in an array; the thin film transistor includes an oxide active layer 4 and a light absorption layer 5 provided above the oxide active layer 4, the light absorption layer 5 is used for absorbing light irradiated thereon, and an orthographic projection of the light absorption layer 5 on the oxide active layer 4 at least partly covers an active region of the oxide active layer 4.

In the array substrate provided by this embodiment, due to the light absorption layer above the oxide active layer of the thin film transistor, and since the orthographic projection of the light absorption layer on the oxide active layer at least partly covers the active region of the oxide active layer, light irradiated on the light absorption layer will be absorbed, which further reduces or avoids light irradiated on the active region of the oxide active layer, so as to reduce or avoid drift of the I-V curve of the thin film transistor, and improve light stability of the oxide semiconductor thin film transistor. As illustrated in FIG. 1, the array substrate may comprise: a gate electrode 2, a gate insulating layer 3, an oxide active layer 4, a light absorption layer 5, a source-drain electrode 6, a pixel electrode 7, a passivation layer 8 and a common electrode 9 sequentially provided on a base substrate 1.

Therein, the oxide active layer 4 may be made of indium tin oxide, indium tin zinc oxide, indium gallium zinc oxide or the like; and a material of the oxide active layer is generally sensitive to external light and has a poor light stability.

The pixel electrode 7 and the common electrode 9 may be respectively made of indium tin oxide, indium zinc oxide, and the like.

The light absorption layer 5 may be prepared by using silicon carbide (SiC) or black zirconia. With SiC as an example, the light absorption layer 5 may be formed by magnetron sputtering or chemical vapor deposition.

Alternatively, the light absorption layer 5 may be prepared by using an organic material containing any one or more of iron, nickel and chromium.

It should be understood that, the above-described light absorption layer 5 is preferably prepared by using a substance capable of absorbing light of all wavelengths, but can also be prepared by using a material capable of absorbing light having a wavelength of less than 420 nm.

It should be noted that, the light absorption layer 5 can be prepared by chemical vapor deposition, plasma enhanced chemical vapor deposition, or a magnetron sputtering method according to properties of the selected material.

Figure 2:
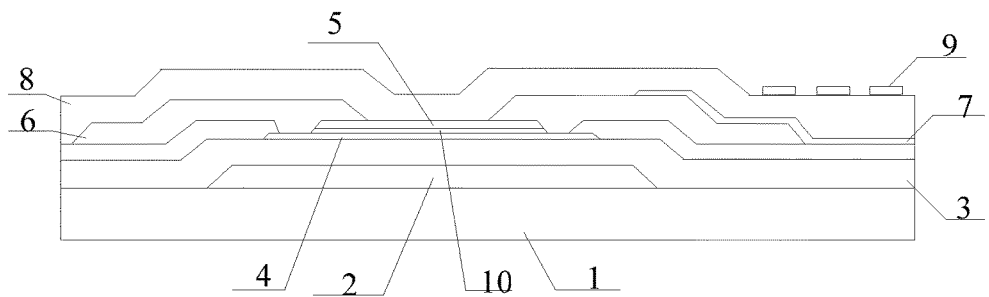
FIG. 2 is a structural schematic diagram of the array substrate provided with an interface improving layer therein provided by Embodiment 1 of the present invention.

In one embodiment, as illustrated in FIG. 2, an interface improving layer 10 may be provided between the light absorption layer 5 and the oxide active layer 4. The interface improving layer 10 can produce a good interfacial effect with the oxide active layer 4, so that a problem that performance of the oxide active layer 4 is deteriorated because the light absorption layer 5 is directly provided on the oxide active layer 4 can be avoided.

The interface improving layer 10 may be prepared by using any one or more selected from the group consisting of silicon oxide (SiOy), silicon oxynitride (SiOxNy), silicon nitride (SiNx) and zirconium oxide. These materials can be better bonded to a surface of the oxide active layer 4, to ensure the performance of the oxide active layer 4.

It should be noted that, the above-described light absorption layer 5 may further be formed as a pattern of an etching blocking layer, and at this time, the formed light absorption layer 5 not only can reduce or avoid irradiation of light onto the oxide active layer 4, but also can protect the oxide active layer 4 during a process of etching a functional layer thereon.

Of course, the array substrate may also have a separate etching blocking layer, and have the light absorption layer 5 provided above or below the etching blocking layer. When the light absorption layer 5 is provided below the etching blocking layer, the interface improving layer 10 may be provided between the light absorption layer 5 and the oxide active layer 4. When the array substrate has a separate etching blocking layer, the present invention does not specifically limit positions of the etching blocking layer and the light absorption layer 5, as long as an orthographic projection of the light absorption layer 5 on the base substrate 1 at least partially covers an orthographic projection of the active region of the oxide active layer 4 on the base substrate 1 (in other words, the orthographic projection of the light absorption layer 5 on the oxide active layer 4 at least partially covers the active region of the oxide active layer 4).

Of course, the light absorption layer 5 may also be provided above or below the passivation layer 8, as long as the orthographic projection of the light absorption layer 5 on the base substrate 1 at least partially covers the orthographic projection of the active region of the oxide active layer 4 on the base substrate 1.

In one example, the orthographic projection of the light absorption layer 5 on the base substrate 1 completely covers the orthographic projection of the active region of the oxide active layer 4 on the base substrate 1, and at this time, the light absorption layer 5 may absorb light irradiated thereon, so that irradiation of light onto the active region of the oxide active layer 4 can be avoided. It can be understood that, in order to ensure a better light transmission of the array substrate, an area of the light absorption layer 5 should not be too large; preferably, the orthographic projection of the light absorption layer 5 on the base substrate 1 completely coincides with the orthographic projection of the active region of the oxide active layer 4 on the base substrate 1, or the former completely covers the latter, and an area of the former is slightly larger than the latter. At this time, not only irradiation of light on the active region of the oxide active layer 4 can be avoided, but also influence on light transmission of the array substrate can be reduced. It should be understood that, preparation methods of respective functional layers of the above-described array substrate are all prior art, which will not be repeated here.

Embodiment 2

Figure 3:
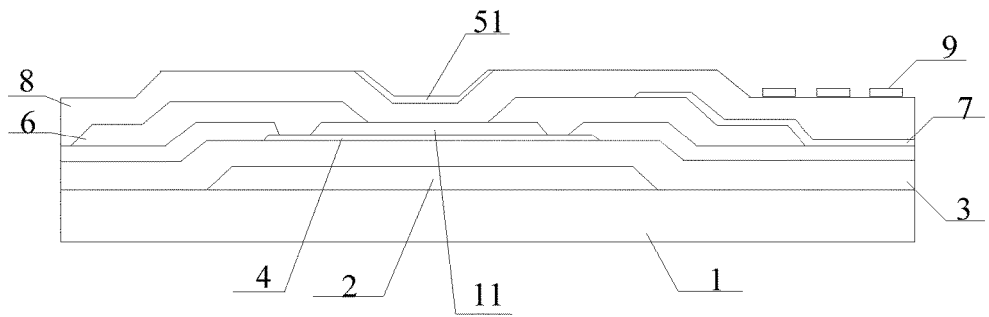
FIG. 3 is a structural schematic diagram of an array substrate provided by Embodiment 2 of the present invention.

This embodiment provides an array substrate of another structure, and as illustrated in FIG. 3, the array substrate provided by this embodiment differs from the array substrate provided by Embodiment 1 in that, a light absorption layer 51 is formed by performing ion injection on a functional layer of the array substrate.

As illustrated in FIG. 3, the array substrate provided by this embodiment comprises: a gate electrode 2, a gate insulating layer 3, an oxide active layer 4, an etching blocking layer 11, a source-drain electrode 6, a pixel electrode 7, a passivation layer 8, a light absorption layer 51 and a common electrode 9 sequentially provided on a base substrate 1.

Therein, the passivation layer 8 is located on the thin film transistor, and is used for protecting the thin film transistor. The light absorption layer 51 is formed by performing ion injection on a partial region of the passivation layer 8 so that an orthographic projection of the formed light absorption layer 51 on the base substrate 1 at least partially covers an orthographic projection of an active region of the oxide active layer 4 on the base substrate 1. In one example, the light absorption layer 51 is formed by performing ion injection on a region of the passivation layer 8 corresponding to the active region of the oxide active layer 4, and at this time, the orthographic projection of the light absorption layer 51 on the base substrate 1 completely coincides with the orthographic projection of the active region of the oxide active layer 4 on the base substrate 1. In this way, the light absorption layer 51 can prevent the oxide active layer 4 from being irradiated with light, without causing drift of the I-V curve of the thin film transistor, which solves the problem of light stability of the oxide semiconductor thin film transistor.

An ion used for ion injection may be selected from any one or more of a carbon ion, an iron ion, a nickel ion and a chromium ion. These ions have a stronger absorption capacity for light of an ultraviolet band or light of a full-wave band, so as to achieve a shading effect.

The process of forming the light absorption layer 51 by performing ion injection on a region of the passivation layer 8 corresponding to the active region of the oxide active layer 4 may include of the following steps: applying photoresist on the passivation layer 8, removing photoresist on a portion corresponding to the active region of the oxide active layer 4 by a patterning process; performing ion injection; and removing the photoresist.

Alternatively, the light absorption layer 51 may be also formed by performing ion injection on a region of the etching blocking layer 11 corresponding to the active region of the oxide active layer 4.

The process of forming the light absorption layer 51 by performing ion injection on a region of the etching blocking layer 11 corresponding to the active region of the oxide active layer 4 may include of the following steps: applying photoresist on the etching blocking layer 11, removing photoresist on a portion corresponding to the active region of the oxide active layer 4 by a patterning process; performing ion injection; and removing the photoresist.

It should be understood that, the above-described passivation layer 8 and the etching blocking layer 11 may be various insulating layers of the thin film transistor, as long as it is provided above the oxide active layer 4 and is suitable for ion injection. In addition, the above-described ion injection is in a scope of the prior art, which will not be repeated here.

It should be noted that, Embodiments 1 and 2 merely illustrate the specific implementing modes with the array substrate comprising the thin film transistor of a bottom gate structure as an example, but the present invention is not limited thereto, and may also be applicable to an array substrate comprising a thin film transistor of a top gate structure.

Embodiment 3

This embodiment provides a display device, comprising any array substrate provided by the above-described embodiments. The display device can be: a liquid crystal panel, electronic paper, an OLED panel, a cellphone, a tablet computer, a television, a display, a laptop, a digital photo frame, a navigator and any product or part with a display function.

It should be understood that the foregoing embodiments are only exemplary embodiments of the present invention to describe the principle of the present invention; however, the present invention is not limited thereto. Those ordinarily skilled in the art can make various changes and modifications without departing from the spirit and essence of the present invention, and such changes and modifications also fall into the protection scope of the present invention.

The invention claimed is:

1. An array substrate, comprising:
a plurality of thin film transistors arranged in an array, each of the thin film transistors includes a base substrate, the base substrate comprising:
a gate electrode,
a gate insulating layer,
an oxide active layer,
a light absorption layer for preventing the oxide active layer from irradiated by light,
a source-drain electrode,
a pixel electrode connected to the source-drain electrode, and
a passivation layer for protecting the thin film transistor,
wherein the gate electrode, the gate insulating layer, the oxide active layer, the source-drain electrode, the pixel electrode, the passivation layer and the light absorption layer are sequentially provided on the base substrate, the passivation layer is directly formed on the pixel electrode, the light absorption layer is directly formed on the passivation layer, an orthographic projection of the light absorption layer on the oxide active layer at least partly covers an active region of the oxide active layer, and the light absorption layer is made of black zirconia.

2. The array substrate according to claim 1, wherein, the thin film transistor includes an etching blocking layer for protecting the oxide active layer, and the light absorption layer is provided above or below the etching blocking layer.

3. The array substrate according to claim 1, wherein, the thin film transistor includes an etching blocking layer for protecting the oxide active layer, and the light absorption layer is formed by performing ion injection on the etching blocking layer.

4. The array substrate according to claim 1, wherein, the light absorption layer is formed by performing ion injection on the passivation layer.

5. The array substrate according to claim 1, wherein, the orthographic projection of the light absorption layer on the oxide active layer covers the active region of the oxide active layer.

6. The array substrate according to claim 5, wherein, the orthographic projection of the light absorption layer on the oxide active layer completely coincides with the active region of the oxide active layer.

7. A display device, comprising the array substrate according to claim 1.

8. The display device according to claim 7, wherein, the thin film transistor includes an etching blocking layer for protecting the oxide active layer, and the light absorption layer is provided above or below the etching blocking layer.

* * * * *